United States Patent
Schultz et al.

(10) Patent No.: US 11,386,009 B2
(45) Date of Patent: Jul. 12, 2022

(54) PROGRAMMABLE DEVICE CONFIGURATION MEMORY SYSTEM

(71) Applicant: XILINX, INC., San Jose, CA (US)

(72) Inventors: David P. Schultz, Longmont, CO (US);
Weiguang Lu, San Jose, CA (US);
Karthy Rajasekharan, Cupertino, CA (US); Shidong Zhou, Milpitas, CA (US); Michael Tsivyan, Campbell, CA (US); Jing Jing Chen, San Jose, CA (US); Sourabh Goyal, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 137 days.

(21) Appl. No.: 16/670,570

(22) Filed: Oct. 31, 2019

(65) Prior Publication Data
US 2021/0133107 A1    May 6, 2021

(51) Int. Cl.
*G06F 12/0855* (2016.01)
*G06F 9/30* (2018.01)
*G06F 12/06* (2006.01)
*G06F 12/0895* (2016.01)
*G06F 13/16* (2006.01)

(52) U.S. Cl.
CPC ........ *G06F 12/0855* (2013.01); *G06F 9/3013* (2013.01); *G06F 12/0653* (2013.01); *G06F 12/0895* (2013.01); *G06F 13/1673* (2013.01)

(58) Field of Classification Search
CPC .. G06F 9/3013; G06F 2/0653; G06F 12/0855; G06F 12/0893; G06F 13/1673; G06F 12/0653
See application file for complete search history.

(56) References Cited

U.S. PATENT DOCUMENTS

| | | | |
|---|---|---|---|
| 6,069,489 A | 5/2000 | Iwanczuk et al. | |
| 6,137,307 A | 10/2000 | Iwanczuk et al. | |
| 6,323,681 B1 | 11/2001 | Iwanczuk et al. | |
| 6,665,766 B1 | 12/2003 | Guccione et al. | |
| 6,836,842 B1 | 12/2004 | Guccione et al. | |
| 7,576,558 B1 | 8/2009 | Lysaght et al. | |
| 7,620,883 B1 | 11/2009 | Carmichael et al. | |
| 7,689,726 B1 | 3/2010 | Sundararajan et al. | |
| 7,973,555 B1 | 7/2011 | Trimberger et al. | |
| 9,401,190 B1 | 7/2016 | Tan et al. | |
| 2017/0221537 A1* | 8/2017 | Tan ........................ | G06F 9/4403 |
| 2019/0043536 A1* | 2/2019 | Weber ...................... | G11C 5/04 |
| 2019/0103872 A1 | 4/2019 | Clark et al. | |

* cited by examiner

*Primary Examiner* — Aracelis Ruiz
(74) *Attorney, Agent, or Firm* — Patterson + Sheridan, LLP

(57) ABSTRACT

An example configuration system for a programmable device includes: a configuration memory read/write unit configured to receive configuration data for storage in a configuration memory of the programmable device, the configuration memory comprising a plurality of frames; a plurality of configuration memory read/write controllers coupled to the configuration memory read/write unit; a plurality of fabric sub-regions (FSRs) respectively coupled to the plurality of configuration memory read/write controllers, each FSR including a pipeline of memory cells of the configuration memory disposed between buffers and a configuration memory read/write pipeline unit coupled between the pipeline and a next one of the plurality of FSRs.

20 Claims, 10 Drawing Sheets

PROGRAMMABLE DEVICE CONFIGURATION MEMORY SYSTEM

TECHNICAL FIELD

Examples of the present disclosure generally relate to programmable devices and, in particular, to a configuration memory system for a programmable device.

BACKGROUND

Programmable devices, such as field programmable gate arrays (FPGAs) and systems-on-chip (SoCs) having FPGA programmable fabrics, are gaining momentum in artificial intelligence (AI), data center, and automotive applications. One technology useful in these applications is partial reconfiguration of the programmable device. Partial reconfiguration is the ability to dynamically modify logic blocks of the programmable device by downloading partial configuration bit files while the remaining logic continues to operate without interruption. Traditionally, partial reconfiguration performance is limited by the distributed memory system in the programmable device, where data lines run across the entire device width and a memory controller must waft for pervious write/reads to complete before it launches the next write/read. It is therefore desirable to improve the performance of the configuration memory system in a programmable device.

SUMMARY

Techniques for providing a configuration memory system in a programmable device are described. In an example, a configuration system for a programmable device includes: a configuration memory read/write unit configured to receive configuration data for storage in a configuration memory of the programmable device, the configuration memory comprising a plurality of frames; a plurality of configuration memory read/write controllers coupled to the configuration memory read/write unit; a plurality of fabric sub-regions (FSRs) respectively coupled to the plurality of configuration memory read/write controllers, each FSR including a pipeline of memory cells of the configuration memory disposed between buffers and a configuration memory read/write pipeline unit coupled between the pipeline and a next one of the plurality of FSRs.

In another example, a programmable device includes: a programmable fabric; a configuration memory for storing data to configure the programmable fabric, the configuration memory comprising a plurality of frames; a configuration memory read/write unit configured to receive configuration data for storage in the configuration memory; a plurality of configuration memory read/write controllers coupled to the configuration memory read/write unit; a plurality of fabric sub-regions (FSRs) respectively coupled to the plurality of configuration memory read/write controllers, each FSR including a pipeline of memory cells of the configuration memory disposed between buffers and a configuration memory read/write pipeline unit coupled between the pipeline and a next one of the plurality of FSRs.

In another example, a method of configuring a programmable device includes: receiving, a configuration memory read/write unit, configuration data for storage in a configuration memory of the programmable device, the configuration memory comprising a plurality of frames; providing the configuration data to a plurality of configuration memory read/write controllers coupled to the configuration memory read/write unit; and providing the configuration data from the plurality of configuration memory read/write controllers to a plurality of fabric sub-regions (FSRs) respectively coupled to the plurality of configuration memory read/write controllers, each FSR including a pipeline of memory cells of the configuration memory disposed between buffers and a configuration memory read/write pipeline unit coupled between the pipeline and a next one of the plurality of FSRs.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
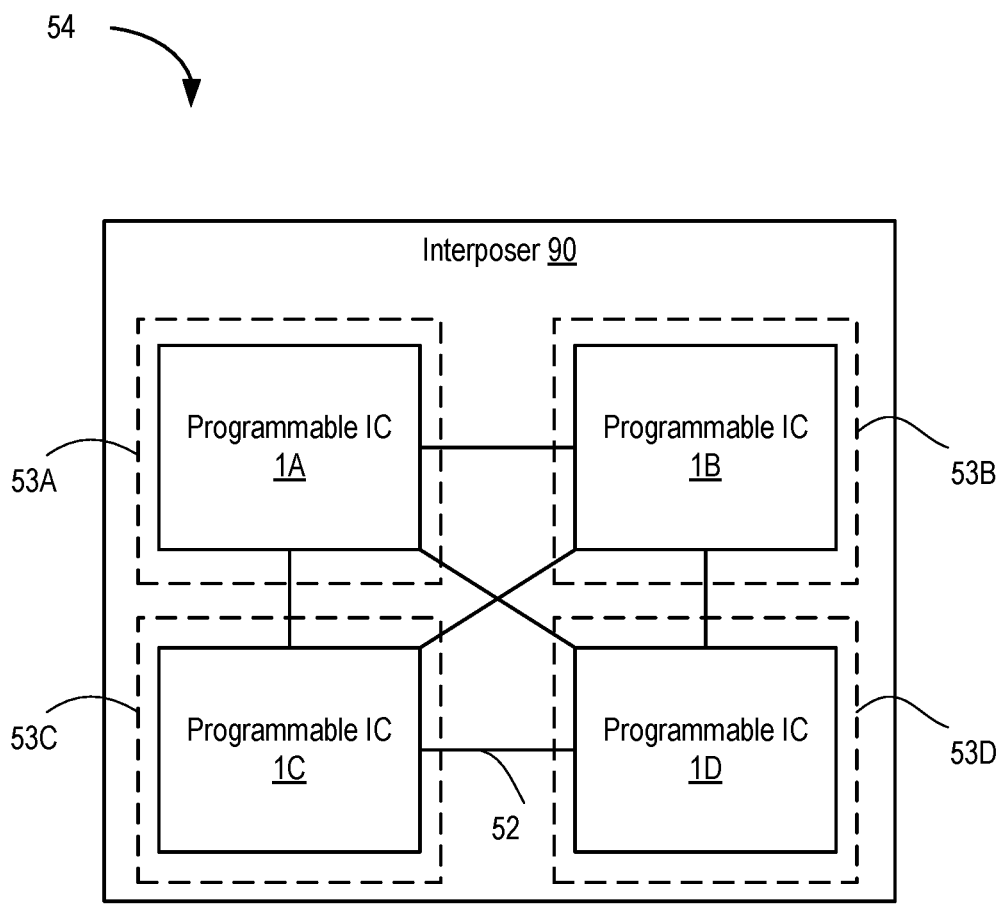
FIG. 1A is a block diagram depicting a programmable device according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing a configuration memory system in a programmable device are described. In examples, the configuration memory system uses a unique structure to pipeline bi-directional data lines with source clocking to achieve improved performance over previous configuration memory systems while minimizing area and cost. The configuration memory system described herein can benefit various applications that utilize partial reconfiguration, including artificial intelligence (AI), data center, automotive applications, as well as applications that require fast device state readback through the configuration memory system, such as emulation applications. These and other aspects are described below with respect to the drawings.

FIG. 1A is a block diagram depicting a programmable device 54 according to an example. The programmable device 54 includes a plurality of programmable integrated circuits (ICs) 1, e.g., programmable ICs 1A, 1B, 1C, and 1D. In an example, each programmable IC 1 is an IC die disposed on an interposer 90. Each programmable IC 1 comprises a super logic region (SLR) 53 of the programmable device 54, e.g., SLRs 53A, 53B, 53C, and 53D. The programmable ICs 1 are interconnected through conductors on the interposer 90 (referred to as super long lines (SLLs) 52).

Figure 1B:
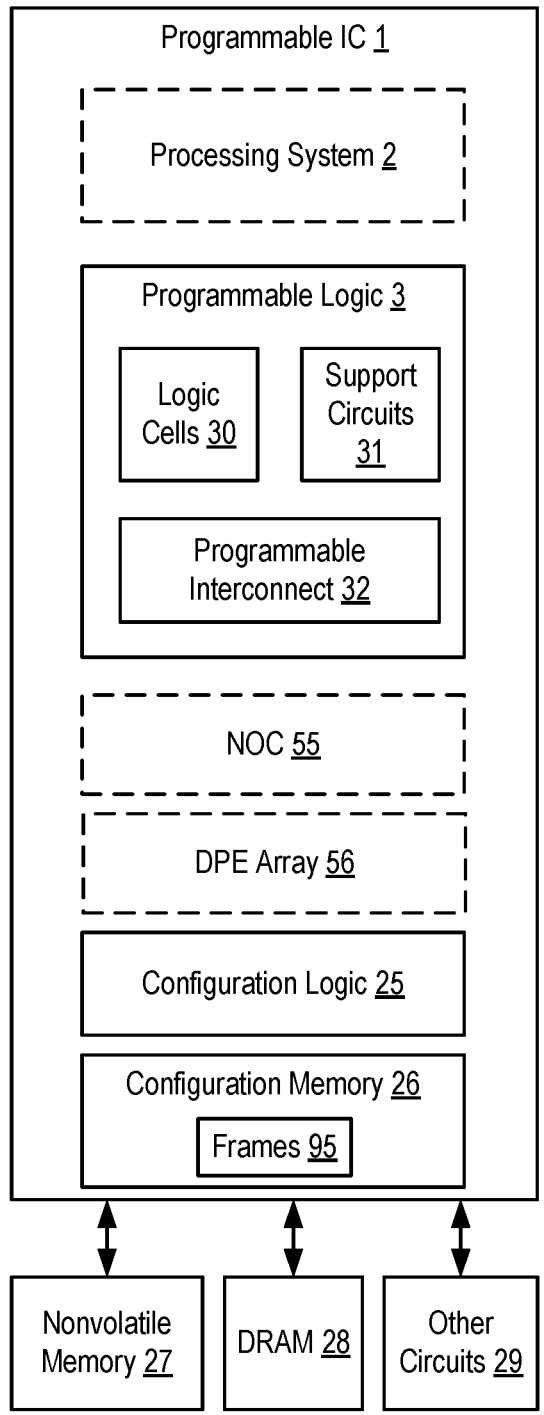
FIG. 1B is a block diagram depicting a programmable IC according to an example.

FIG. 1B is a block diagram depicting a programmable IC 1 according to an example. The programmable IC 1 can be used to implement the programmable device 128 or one of the programmable ICs 1A-1D in the programmable device 54. The programmable IC 1 includes programmable logic 3 (also referred to as a programmable fabric), configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration memory 26 is organized into a plurality of frames 95. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like. In some examples, the programmable IC 1 includes a network-on-chip (NOC) 55 and data processing engine (DPE) array 56. The NOC 55 is configured to provide for communication between subsystems of the programmable IC 1, such as between the PS 2, the PL 3, and the DPE array 56. The DPE array 56 can include an array of DPE's configured to perform data processing, such as an array of vector processors.

Figure 1C:
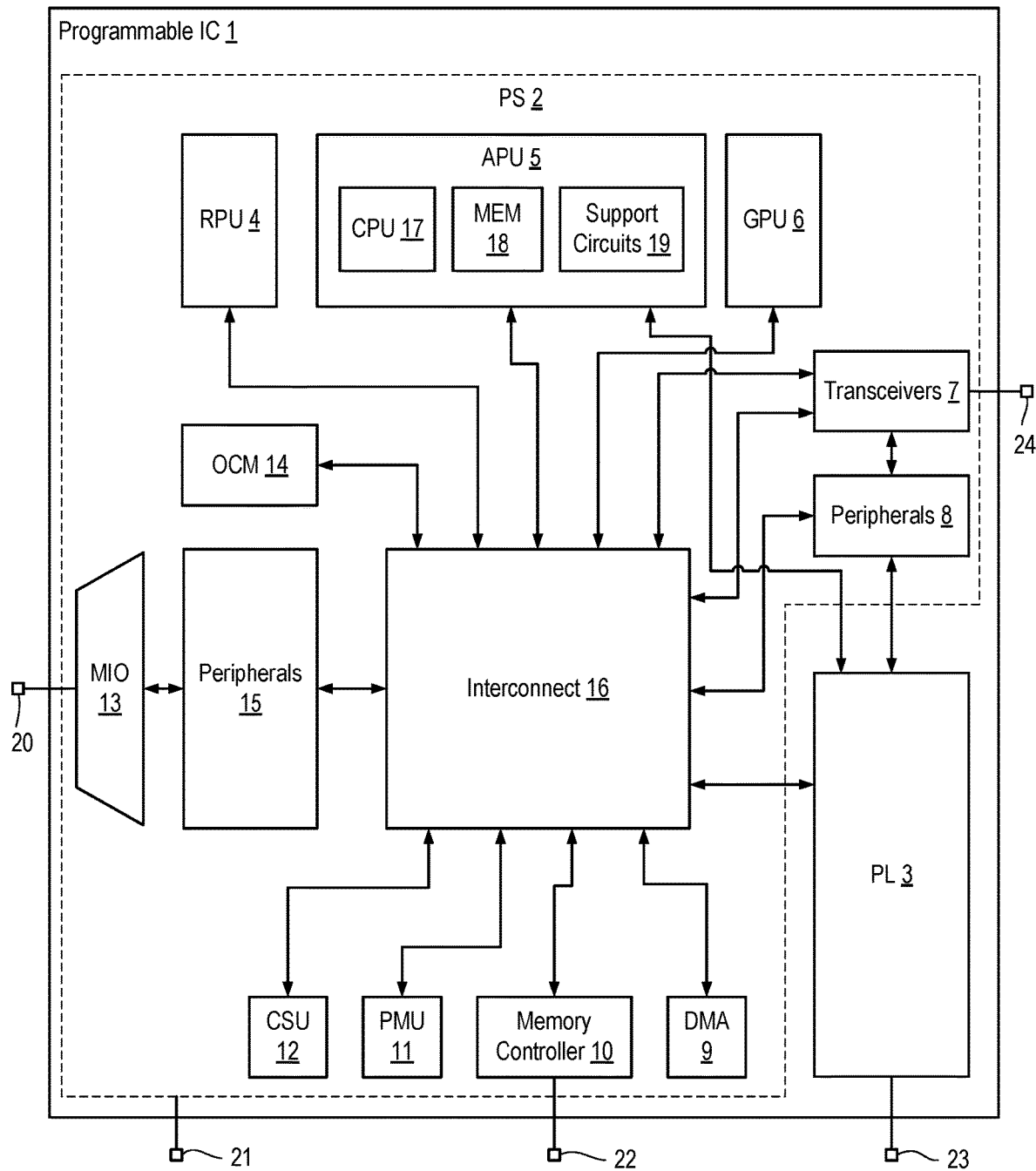
FIG. 1C is a block diagram depicting an SOC implementation of the programmable IC according to an example.

FIG. 1C is a block diagram depicting an SOC implementation of the programmable IC 1 according to an example. In the example, the programmable IC 1 includes the processing system 2 and the programmable logic 3. The processing system 2 includes various processing units, such as a real-time processing unit (RPU) 4, an application processing unit (APU) 5, a graphics processing unit (GPU) 6, a configuration and security unit (CSU) 12, a platform management unit (PMU) 11, and the like. The processing system 2 also includes various support circuits, such as on-chip memory (OCM) 14, transceivers 7, peripherals 8, interconnect 16, DMA circuit 9, memory controller 10, peripherals 15, and multiplexed 10 (MIO) circuit 13. The processing units and the support circuits are interconnected by the interconnect 16. The PL 3 is also coupled to the interconnect 16. The transceivers 7 are coupled to external pins 24. The PL 3 is coupled to external pins 23. The memory controller 10 is coupled to external pins 22. The MIO 13 is coupled to external pins 20. The PS 2 is generally coupled to external pins 21. The APU 5 can include a CPU 17, memory 18, and support circuits 19.

Referring to the PS 2, each of the processing units includes one or more central processing units (CPUs) and associated circuits, such as memories, interrupt controllers, direct memory access (DMA) controllers, memory management units (MMUs), floating point units (FPUs), and the like. The interconnect 16 includes various switches, busses, communication links, and the like configured to interconnect the processing units, as well as interconnect the other components in the PS 2 to the processing units.

The OCM 14 includes one or more RAM modules, which can be distributed throughout the PS 2. For example, the OCM 14 can include battery backed RAM (BBRAM), tightly coupled memory (TCM), and the like. The memory controller 10 can include a DRAM interface for accessing external DRAM. The peripherals 8, 15 can include one or more components that provide an interface to the PS 2. For example, the peripherals 15 can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose 10 (GPIO) ports, serial advanced technology attachment (SATA) ports, PCIe ports, and the like. The peripherals 15 can be coupled to the MIO 13. The peripherals 8 can be coupled to the transceivers 7. The transceivers 7 can include serializer/deserializer (SERDES) circuits, multi-gigabit transceivers (MGTs), and the like.

Figure 1D:
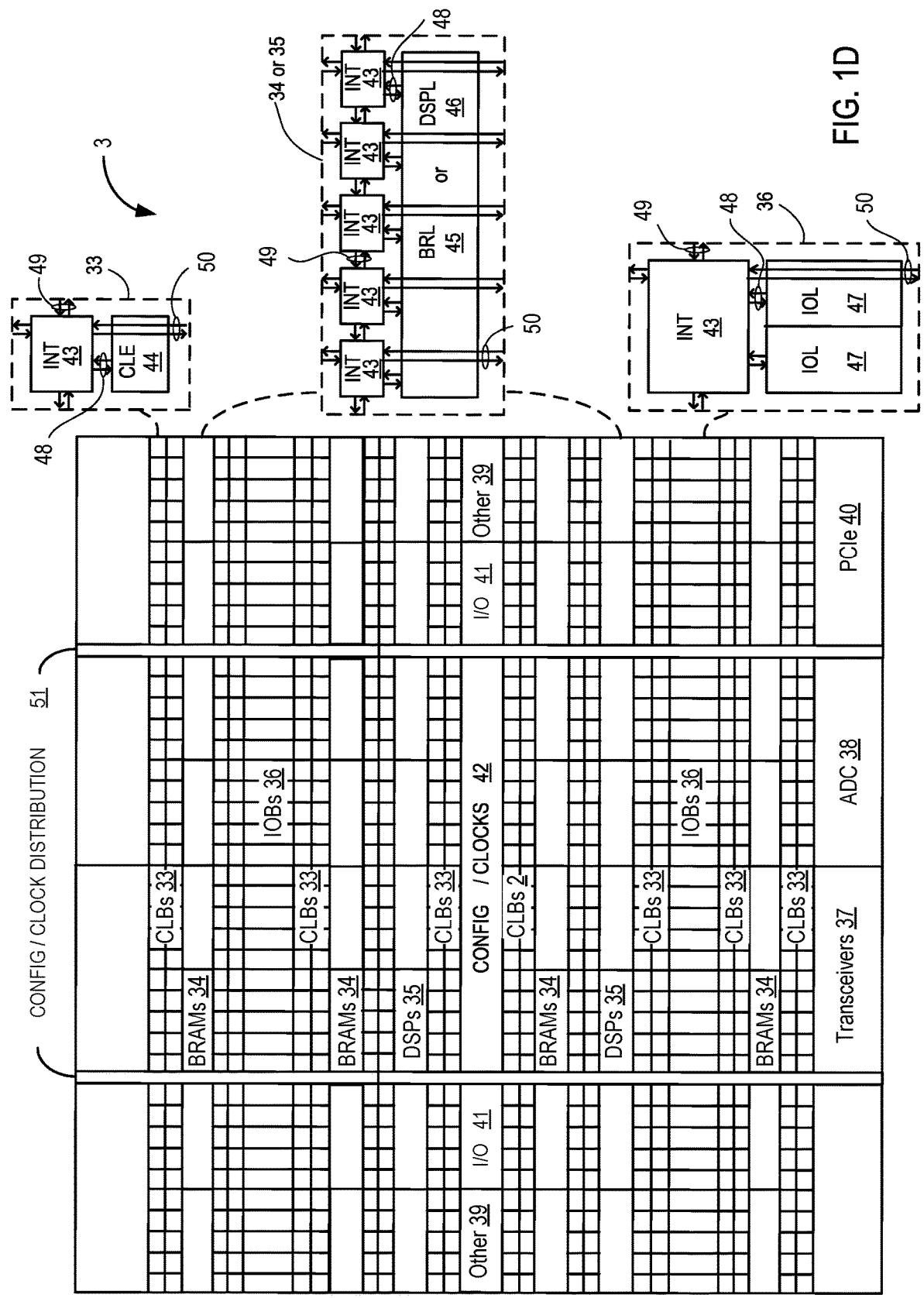
FIG. 1D illustrates a field programmable gate array (FPGA) implementation of the programmable IC that includes the PL according to an example.

FIG. 1D illustrates a field programmable gate array (FPGA) implementation of the programmable IC 1 that includes the PL 3. The PL 3 shown in FIG. 1D can be used in any example of the programmable devices described herein. The PL 3 includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The PL 3 can also include PCIe interfaces 40, analog-to-digital converters (ADC) 38, and the like.

In some PLs, each programmable tile can include at least one programmable interconnect element ("INT") 43 having connections to input and output terminals 48 of a programmable logic element within the same tile, as shown by examples included at the top of FIG. 1D. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated PL.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 3D) is used for configuration, clock, and other control logic. Vertical columns 51 extending from this horizontal area or column are used to distribute the clocks and configuration signals across the breadth of the PL.

Some PLs utilizing the architecture illustrated in FIG. 1D include additional logic blocks that disrupt the regular columnar structure making up a large part of the PL. The additional logic blocks can be programmable blocks and/or dedicated logic. Note that FIG. 1D is intended to illustrate only an exemplary PL architecture. For example, the numbers of logic blocks in a row, the relative width of the rows, the number and order of rows, the types of logic blocks included in the rows, the relative sizes of the logic blocks, and the interconnect/logic implementations included at the top of FIG. 1D are purely exemplary. For example, in an actual PL more than one adjacent row of CLBs is typically included wherever the CLBs appear, to facilitate the efficient implementation of user logic, but the number of adjacent CLB rows varies with the overall size of the PL.

Figure 2:
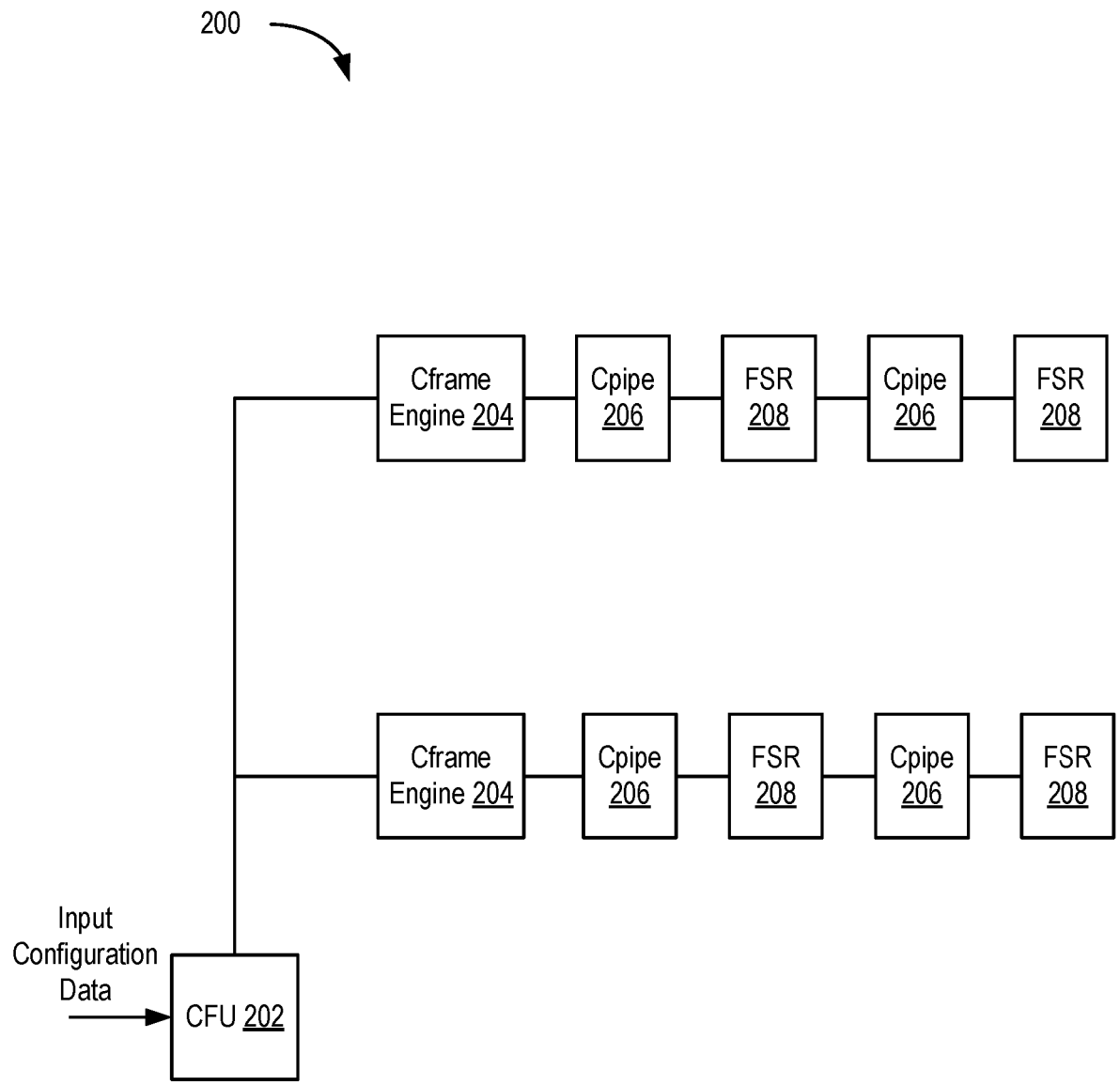
FIG. 2 is a block diagram depicting a configuration subsystem according to an example.

FIG. 2 is a block diagram depicting a configuration subsystem 200 according to an example. The configuration subsystem 200 is disposed in the programmable IC 1, for example, to configure the programmable logic therein. The configuration subsystem 200 includes a configuration memory read/write unit (referred to herein as a Cframe unit (CFU) 202), a plurality of configuration memory read/write controllers (referred to herein as Cframe engines 204), a plurality of configuration memory read/write pipeline units (referred to herein as Cpipes 206), and configuration memory cells in fabric sub regions (FSRs) 208. The CFU 202 can be disposed in a platform management controller or like component of the programmable IC 1 (e.g., the PMU 11). The CFU 202 is configured to receive input configuration data for the programmable IC. The CFU 202 functions as the master configuration controller for the configuration subsystem 200.

The CFU 202 is coupled to each of the Cframe engines 204. Each Cframe engine 204 comprises a configuration frame write/read controller. A "frame" is a unit of configuration data to be stored or read from a set of configuration memory cells. A frame has a "height" based on a number of configuration memory cells for which it contains data. Each Cframe engine 204 provides data to one or more FSRs 208 through a pipeline comprising Cpipes 206 and FSRs 208. The Cpipes 206 are described further below. Each FSR 208 is a region of programmable logic and associated configuration memory that has the height of a frame.

Figure 3:
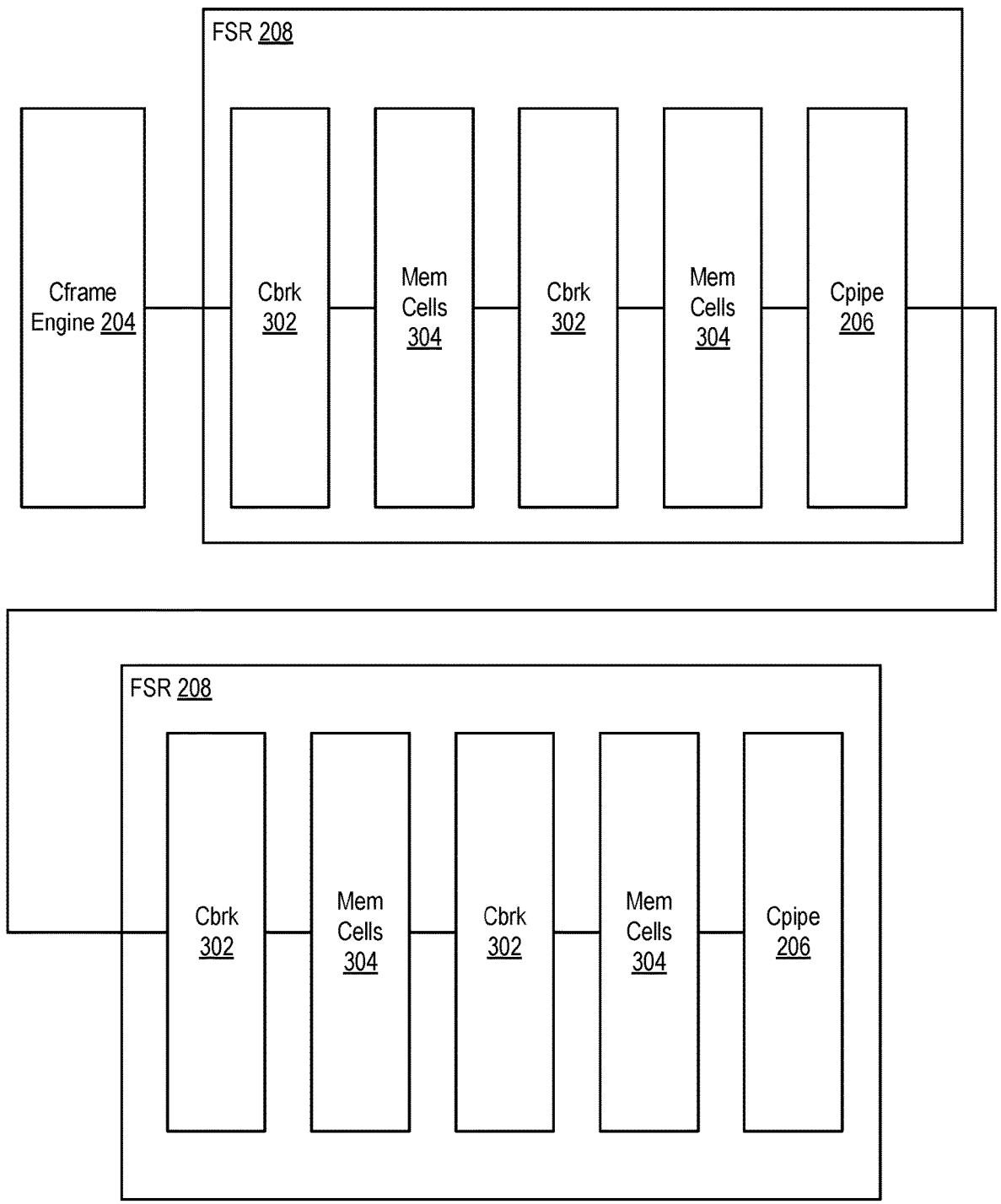
FIG. 3 is a block diagram depicting a configuration pipeline according to an example.

FIG. 3 is a block diagram depicting a configuration pipeline 300 according to an example. The configuration pipeline 300 includes a Cframe engine 204 and one or more FSRs 208 (e.g., two are shown). Each FSR 208 includes buffers (Cbrk 302), configuration memory cells (mem cells 304), and a Cpipe 206. Each Cbrk 302 includes bi-directional buffers. Mem cells 304 are disposed between Cbrks 302. In general, each FSR 208 includes one or more Cbrks 302 with mem cells 304 disposed therebetween. In operation, configuration data is provided from the Cframe engine 204 to the mem cells 304 through the Cbrks 302. In an example, each FSR 208 includes a Cpipe 206 (e.g., disposed at the end of the Cbrk-memory cells chain). Without the Cpipe 206, the data lines run across the entire width of the FSRs 208, which limits the configuration memory write/read bandwidth. By adding a Cpipe 206 per FSR 208, the datalines are segmented between consecutive Cpipes 206. The dataline segments are less than the width of the FSRs 208, which improves configuration memory write/read bandwidth.

Figure 4:
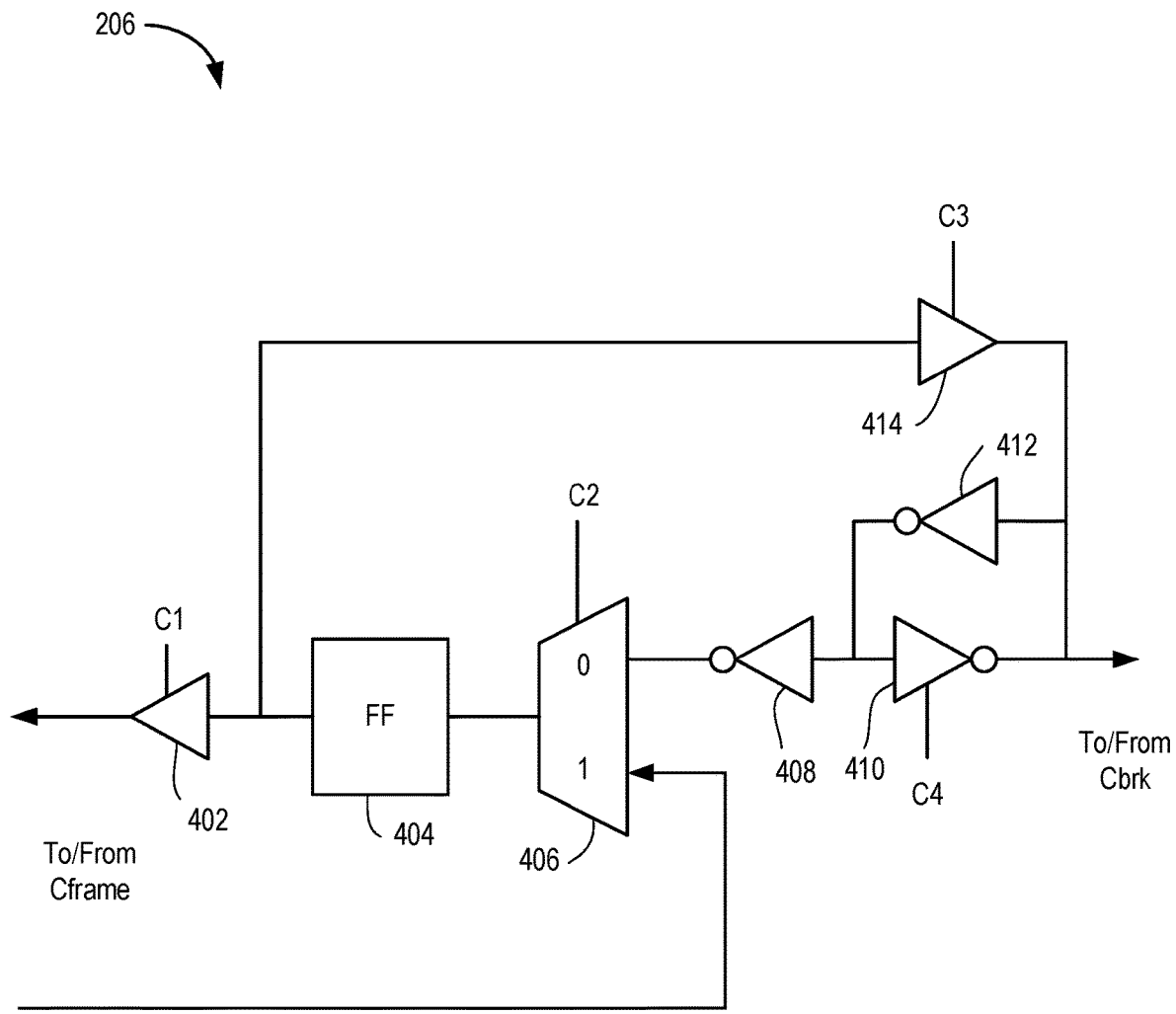
FIG. 4 is a block diagram depicting a configuration memory read/write pipeline unit according to an example.

FIG. 4 is a block diagram depicting a Cpipe 206 according to an example. The Cpipe 206 includes a buffer 402, a flip-flop 404, a multiplexer 406, an inverter 408, an inverter 410, an inverter 412, and a buffer 414. An input ("1") of the multiplexer 406 is coupled to the Cframe engine 204 (e.g., either directly or through other component(s)). Another input ("0") of the multiplexer 406 is coupled to an output of the inverter 408. A control input of the multiplexer 406 is coupled to a control signal C2. An output of the multiplexer 406 is coupled to an input of the flip-flop 404. An output of the flip-flop 404 is coupled to an input of the buffer 402. An output of the buffer 402 is coupled to the Cframe engine 204 (e.g., either directly or through other component(s)). In an example, the buffer 402 is a three-state buffer and includes a control input coupled to a control signal C1.

The output of the flip-flop 404 is coupled to an input of the buffer 414. An output of the buffer 414 is coupled to a Cbrk 302. In an example, the buffer 414 is a three-state buffer and includes a control input coupled to a control signal C3. An input of the inverter 412 is coupled to the Cbrk 302. An output of the inverter 412 is coupled to an input of the inverter 408. An input of the inverter 410 is coupled to the output of the inverter 412. An output of the inverter 410 is coupled to the Cbrk 302. In an example, the inverter 410 is a three-state inverter and includes a control input coupled to a signal C4. In FIG. 4, the circuitry for one data line is shown. The circuitry is repeated for each data line traversing the Cpipe 206.

In operation, during a write, configuration data is coupled to the "1" input of the multiplexer 406. The control signal C2 is set to select the "1" input of the multiplexer 406. The configuration data is stored in the flip-flop 404 and then received by the Cbrk 302 through the buffer 414. The control signal C3 is set to enable the buffer 414. The control signal C4 is set to disable the inverter 410. In this manner, configuration data passes from the Cframe engine 204 through the Cpipe 206 to the Cbrk 302 for writing to configuration memory.

During a read, readback data is coupled to the "0" input of the multiplexer 406. In particular, the inverter 412 and the inverter 410 form a latch for latching the readback data from the Cbrk 302. The latched readback data is coupled to the "0" input of the multiplexer 406 through the inverter 408. The control signal C4 is set to enable the inverter 410 and hence the latch. The control signal C2 is set to select the "0" input of the multiplexer 406. The readback data is stored in the flip-flop 404 and read by the Cframe engine 204 through the buffer 402. The control signal C1 is set to enable the buffer 402. The control signal C3 is set to disable the buffer 414. In this manner, readback data passes from a Cbrk 302 to the Cframe engine 204 for reading from the configuration memory.

Figure 5:
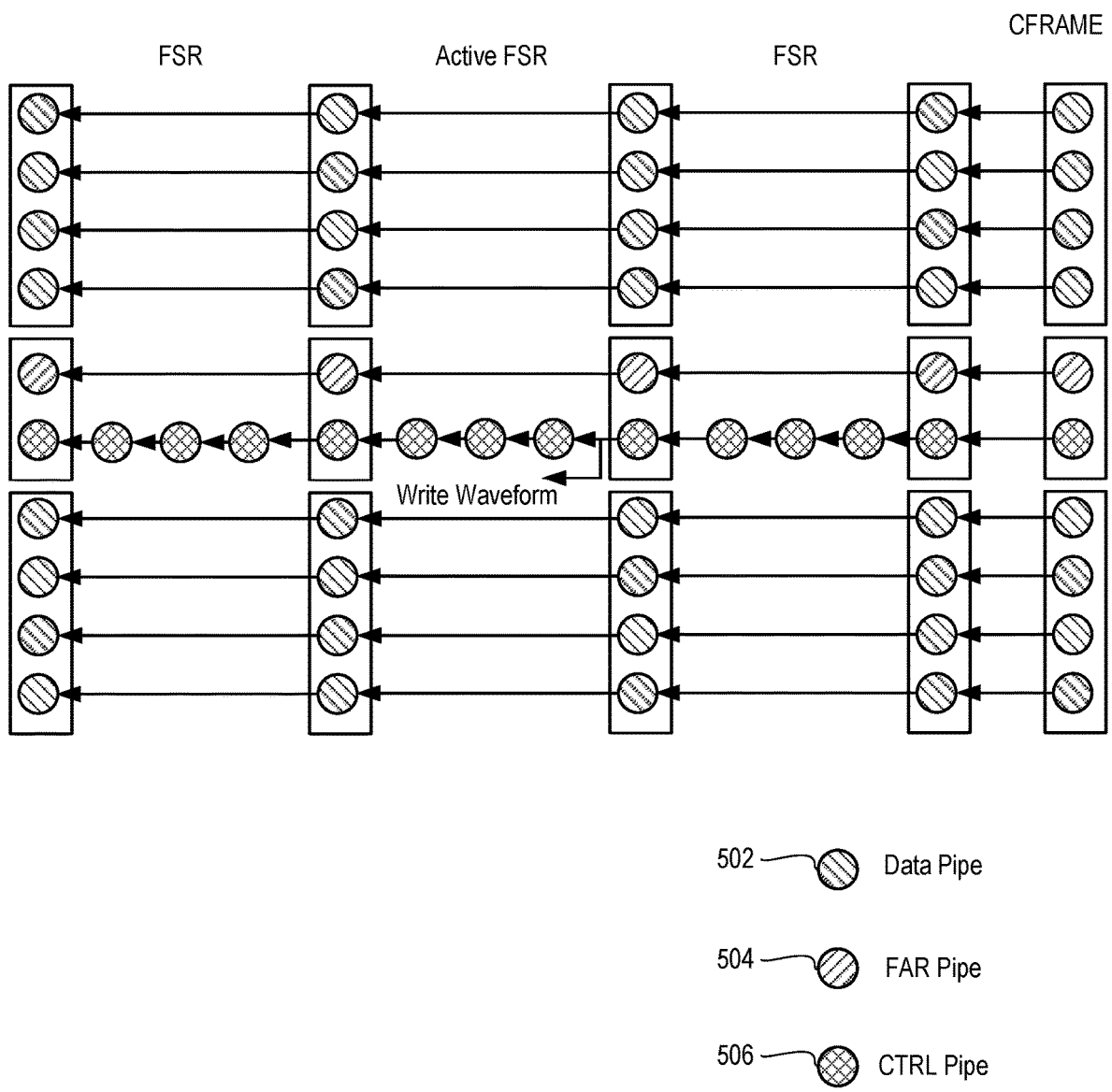
FIG. 5 is a schematic diagram depicting the write operation according to an example.

FIG. 5 is a schematic diagram depicting the write operation according to an example. The circles in the center of the diagram (labeled CTRL pipe) are symbolic pipeline stages to match data line propagation delay. In an example, there are three types of pipes: Data line pipe 502 (labeled Data pipe), frame address register (FAR) pipe 504 (labeled FAR pipe), and CTRL pipe 506. The Data pipe 502 propagates the configuration data, the FAR pipe 504 propagates the address information for the configuration memory to be configured, and the CTRL pipe 506 propagates the control signals for latching the data pipe and the FAR pipe 504.

During the write operation, the Cframe engine 204 generates a write waveform, which includes frame data and the necessary control signals/sequences. The entire waveform must now propagate through the Cpipe 206 in lock step. The control signal path includes an extra pipeline stage to match the dataline propagation time. The dataline pipeline 502 is a multiple cycle path, thus a tag/token is used to latch the dataline value at the Cpipe 206 after it is stable. Each FSR 208 decodes the frame address locally to determine whether the waveform is for it or not. The waveform flows from Cframe engine 204 to the edge of the device regardless of the targeted frame location.

Figure 6:
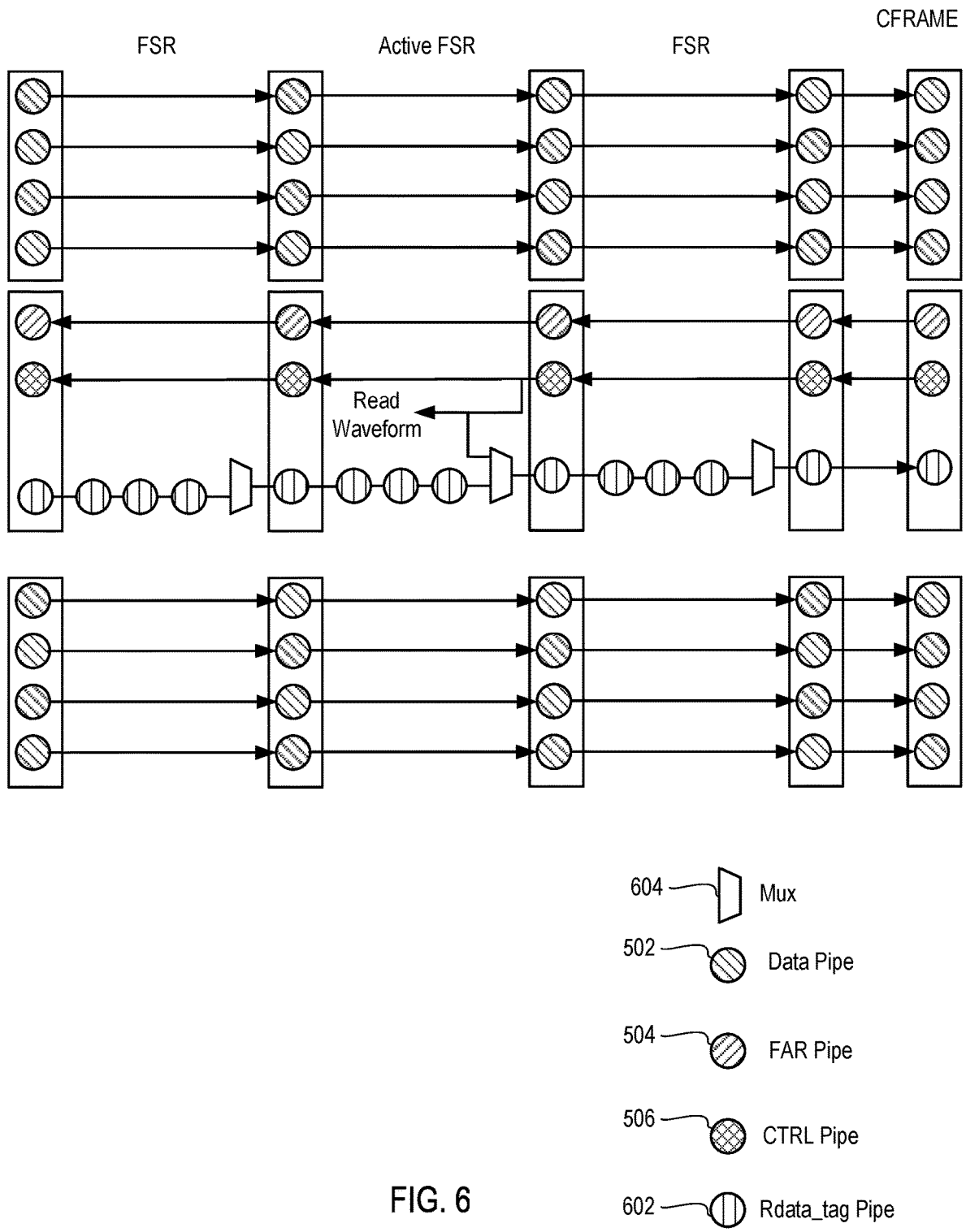
FIG. 6 is a schematic diagram depicting the read operation according to an example.

FIG. 6 is a schematic diagram depicting the read operation according to an example. The Cframe engine generated read waveform (no data), FAR 504, control 506, and rdata_tag 602 propagates to the edge of the device. The dataline 502 propagates back to the Cframe engine 204. Each frame decodes the read FAR, and only the active frame will be obtained from the frame read. The read data is captured by rdata_tag into the cpipe and then propagates back to the Cframe engine 204. In FIG. 6, FAR and control does not show the extra circles in the center of the diagram because there is no need to match dataline propagation during the read operation as there was during the write operation. In examples, additional pipeline stages could be added for FAR and control as with the write operation for timing or noise reduction purposes. Multiplexers (Mux) are provided to multiplex the rdata_tag and the read waveform for each FSR.

Since rdata_tag runs against clock (which is sourced from the Cframe engine 204 to the edge of the device), the tag must be at least two clocks wide to make sure to not be missed by the next Cframe's synchronizer. After synchronization, the rdata_tag is stretched back to at least two clocks wide. Rdata_tag is used to latch read data on the dataline, which propagates slowly. The additional circles for rdata_tag are present to match propagation delay.

The configuration system described herein uses source clocking. The configuration system does not use a clock tree due to its distributed nature. It is difficult to stop the pipeline once the transaction leaves the Cframe engine 204. Thus, the Cframe engine 204 must parse the incoming transaction it received and police the traffic to the pipeline to make sure the pipeline will not be overrun. The distributed pipeline can also generate a read hazard condition. If a new read is closer to the Cframe engine 204 than a previous read, the read data may collide. Thus, the Cframe engine 204 can detect such a hazard and delay the new transaction as necessary.

For frame addressing, in previous systems, the frame address is column/major address based. That is, each block has its unique column/major address and within each column it has N frames. Once N frames is reached, the column/major address is incremented based on a feedback signal. The configuration system described herein uses a linear address scheme, which eliminates any performance limitations associated with the previous scheme described above.

Figure 7:
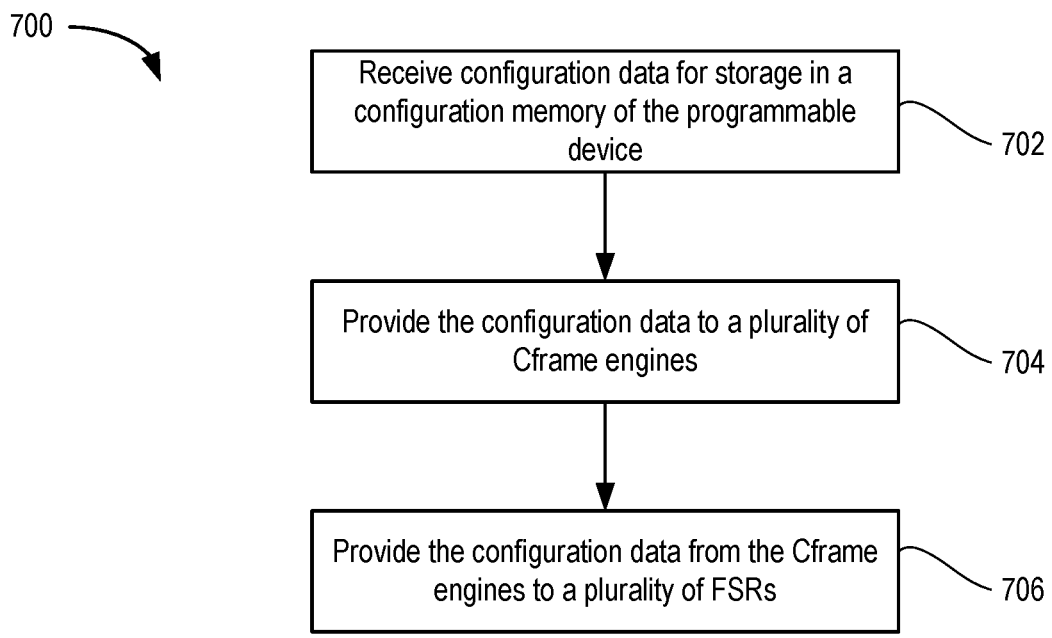
FIG. 7 is a flow diagram depicting a method of configuring a programmable device according to an example.

FIG. 7 is a flow diagram depicting a method 700 of configuring a programmable device according to an example. The method 700 begins at step 702, where the CFU 202 receives configuration data for storage in the configuration memory 26 of the programmable device 1. The configuration memory 26 comprises a plurality of frames 95. At step 704, the CFU 202 provides the configuration data to a plurality of Cframe engines 204 coupled to the CFU 202. At step 706, the Cframe engines 204 provide the configuration data to a plurality of FSRs 208. Each FSR 208 includes a pipeline of memory cells 304 of the configuration memory disposed between buffers (Cbrk 302) and a Cpipe circuit 206 coupled between the pipeline and a next one of the FSRs 208.

While the foregoing is directed to specific examples, other and further examples may be devised without departing from the basic scope thereof, and the scope thereof is determined by the claims that follow.

What is claimed is:

1. A configuration system for a programmable device, comprising:
 a configuration memory read/write unit configured to receive configuration data for storage in a configuration memory of the programmable device, the configuration memory comprising a plurality of frames;
 a plurality of configuration memory read/write controllers coupled to the configuration memory read/write unit; and
 a plurality of fabric sub-regions (FSRs) respectively coupled to the plurality of configuration memory read/write controllers, each FSR of the plurality of FSRs including a pipeline of memory cells of the configuration memory disposed between buffers and a configuration memory read/write pipeline unit coupled between the pipeline and a next one of the plurality of FSRs and to a respective one of the plurality of configuration memory read/write controllers, wherein the configuration memory read/write pipeline unit in each of the plurality of FSRs includes:
  a flip-flop having an output coupled to the respective one of the plurality of configuration memory read/write controllers; and
  a multiplexer having an output coupled to an input of the flip-flop, a first input coupled to the respective one of the plurality of configuration memory read/write controllers, and a second input coupled to one of the buffers in the respective FSR.

2. The configuration system of claim 1, wherein the configuration memory read/write pipeline unit in each of the plurality of FSRs further includes:
a first buffer coupled to the output of the flip-flop, an output of the first buffer coupled to the respective one of the plurality of configuration memory read/write controllers.

3. The configuration system of claim 2, wherein the configuration memory read/write pipeline unit in each of the plurality of FSRs includes:
a first inverter having an output coupled to the second input of the multiplexer;
a second inverter having an input coupled to an input of the first inverter, and an output coupled to the one of the buffers; and
a third inverter having an output coupled to the input of the first inverter, and an input coupled to the one of the buffers.

4. The configuration system of claim 3, wherein the configuration memory read/write pipeline unit in each of the plurality of FSRs includes:
a second buffer having an input coupled to the output of the flip-flop, and an input coupled to the one of the buffers.

5. The configuration system of claim 4, wherein each of the first and second buffers comprises a three-state buffer, and wherein the third inverter comprises a three-state inverter.

6. The configuration system of claim 1, wherein the pipeline in each of the plurality of FSRs includes a dataline pipe, a frame address register (FAR) pipe, and a control pipe, where the dataline pipe propagates configuration data, the FAR pipe propagates address information, and the control pipe propagates control signals for latching the dataline pipe and the FAR pipe.

7. The configuration system of claim 6, wherein the pipeline in each of the plurality of FSRs includes a tag pipe configured to latch read data on the dataline pipe.

8. A programmable device, comprising:
a programmable fabric;
a configuration memory for storing data to configure the programmable fabric, the configuration memory comprising a plurality of frames;
a configuration memory read/write unit configured to receive configuration data for storage in the configuration memory;
a plurality of configuration memory read/write controllers coupled to the configuration memory read/write unit; and
a plurality of fabric sub-regions (FSRs) respectively coupled to the plurality of configuration memory read/write controllers, each FSR including a pipeline of memory cells of the configuration memory disposed between buffers and a configuration memory read/write pipeline unit coupled between the pipeline and a next one of the plurality of FSRs and to a respective one of the plurality of configuration memory read/write controllers, wherein the configuration memory read/write pipeline unit in each of the plurality of FSRs includes:
a flip-flop having an output coupled to the respective one of the plurality of configuration memory read/write controllers; and
a multiplexer having an output coupled to an input of the flip-flop, a first input coupled to the respective one of the plurality of configuration memory read/write controllers, and a second input coupled to one of the buffers in the respective FSR.

9. The programmable device of claim 8, wherein the configuration memory read/write pipeline unit in each of the plurality of FSRs further includes:
a first buffer coupled to the output of the flip-flop, an output of the first buffer coupled to the respective one of the plurality of configuration memory read/write controllers.

10. The programmable device of claim 9, wherein the configuration memory read/write pipeline unit in each of the plurality of FSRs includes:
a first inverter having an output coupled to the second input of the multiplexer;
a second inverter having an input coupled to an input of the first inverter, and an output coupled to the one of the buffers; and
a third inverter having an output coupled to the input of the first inverter, and an input coupled to the one of the buffers.

11. The programmable device of claim 10, wherein the configuration memory read/write pipeline unit in each of the plurality of FSRs includes:
a second buffer having an input coupled to the output of the flip-flop, and an input coupled to the one of the buffers.

12. The programmable device of claim 11, wherein each of the first and second buffers comprises a three-state buffer, and wherein the third inverter comprises a three-state inverter.

13. The programmable device of claim 8, wherein the pipeline in each of the plurality of FSRs includes a dataline pipe, a frame address register (FAR) pipe, and a control pipe, where the dataline pipe propagates configuration data, the FAR pipe propagates address information, and the control pipe propagates control signals for latching the dataline pipe and the FAR pipe.

14. The programmable device of claim 13, wherein the pipeline in each of the plurality of FSRs includes a tag pipe configured to latch read data on the dataline pipe.

15. A method of configuring a programmable device, comprising:
receiving, at configuration memory read/write unit, configuration data for storage in a configuration memory of the programmable device, the configuration memory comprising a plurality of frames;
providing the configuration data to a plurality of configuration memory read/write controllers coupled to the configuration memory read/write unit; and
providing the configuration data from the plurality of configuration memory read/write controllers to a plurality of fabric sub-regions (FSRs) respectively coupled to the plurality of configuration memory read/write controllers, each FSR including a pipeline of memory cells of the configuration memory disposed between buffers and a configuration memory read/write pipeline unit coupled between the pipeline and a next one of the plurality of FSRs and to a respective one of the plurality of configuration memory read/write controllers, wherein the configuration memory read/write pipeline unit in each of the plurality of FSRs includes:
a flip-flop having an output coupled to the respective one of the plurality of configuration memory read/write controllers; and
a multiplexer having an output coupled to an input of the flip-flop, a first input coupled to the respective one of the plurality of configuration memory read/write controllers, and a second input coupled to one of the buffers in the respective FSR.

16. The method of claim 15, wherein the configuration memory read/write pipeline unit in each of the plurality of FSRs further includes:
- a first buffer coupled to the output of the flip-flop, an output of the first buffer coupled to the respective one of the plurality of configuration memory read/write controllers.

17. The method of claim 16, wherein the configuration memory read/write pipeline unit in each of the plurality of FSRs includes:
- a first inverter having an output coupled to the second input of the multiplexer;
- a second inverter having an input coupled to an input of the first inverter, and an output coupled to the one of the buffers; and
- a third inverter having an output coupled to the input of the first inverter, and an input coupled to the one of the buffers.

18. The method of claim 17, wherein the configuration memory read/write pipeline unit in each of the plurality of FSRs includes:
- a second buffer having an input coupled to the output of the flip-flop, and an input coupled to the one of the buffers.

19. The method of claim 18, wherein each of the first and second buffers comprises a three-state buffer, and wherein the third inverter comprises a three-state inverter.

20. The method of claim 15, wherein the pipeline in each of the plurality of FSRs includes a dataline pipe, a frame address register (FAR) pipe, and a control pipe, where the dataline pipe propagates configuration data, the FAR pipe propagates address information, and the control pipe propagates control signals for latching the dataline pipe and the FAR pipe.

* * * * *